(12) United States Patent
Chang et al.

(10) Patent No.: US 12,046,671 B2
(45) Date of Patent: Jul. 23, 2024

(54) SEMICONDUCTOR DEVICE AND MANUFACTURING METHOD THEREOF

(71) Applicant: UNITED MICROELECTRONICS CORP., Hsin-Chu (TW)

(72) Inventors: Che-Hua Chang, New Taipei (TW); Shin-Hung Li, Nantou County (TW); Tsung-Yu Yang, Chiayi County (TW); Ruei-Jhe Tsao, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 282 days.

(21) Appl. No.: 17/569,527

(22) Filed: Jan. 6, 2022

(65) Prior Publication Data

US 2023/0187547 A1  Jun. 15, 2023

(30) Foreign Application Priority Data

Dec. 13, 2021  (CN) .......................... 202111515735.4

(51) Int. Cl.
*H01L 29/78* (2006.01)
*H01L 29/10* (2006.01)
*H01L 29/40* (2006.01)
*H01L 29/423* (2006.01)
*H01L 29/66* (2006.01)

(52) U.S. Cl.
CPC ...... *H01L 29/7825* (2013.01); *H01L 29/1095* (2013.01); *H01L 29/401* (2013.01); *H01L 29/42368* (2013.01); *H01L 29/66704* (2013.01)

(58) Field of Classification Search
CPC ..................... H01L 29/4236; H01L 29/42368
See application file for complete search history.

(56) References Cited

U.S. PATENT DOCUMENTS

| 4,660,062 | A | 4/1987 | Nishizawa | |
| 5,371,024 | A * | 12/1994 | Hieda | H01L 29/66621 257/E29.267 |
| 6,391,698 | B1 | 5/2002 | Tung | |
| 10,388,758 | B2 | 8/2019 | Liao | |
| 10,600,908 | B2 | 3/2020 | Huang | |
| 2006/0141726 | A1* | 6/2006 | Kim | H01L 29/1083 257/E29.267 |
| 2007/0152245 | A1* | 7/2007 | Ko | H01L 29/66621 257/E21.429 |
| 2010/0140687 | A1 | 6/2010 | Chu | |

* cited by examiner

*Primary Examiner* — Raj R Gupta
(74) *Attorney, Agent, or Firm* — Winston Hsu (57) ABSTRACT

A semiconductor device includes a semiconductor substrate, a trench, and a gate structure. The trench is disposed in the semiconductor substrate. The gate structure is disposed on the semiconductor substrate. The gate structure includes a gate electrode, a first gate oxide layer, and a second gate oxide layer. A first portion of the gate electrode is disposed in the trench, and a second portion of the gate electrode is disposed outside the trench. The first gate oxide layer is disposed between the gate electrode and the semiconductor substrate. At least a portion of the first gate oxide layer is disposed in the trench. The second gate oxide layer is disposed between the second portion of the gate electrode and the semiconductor substrate in a vertical direction. A thickness of the second gate oxide layer is greater than a thickness of the first gate oxide layer.

10 Claims, 10 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including gate oxide layers with different thicknesses and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, as the requirements of related products become higher and higher, how to improve the electrical performance, the reliability, and/or the distribution density of high voltage semiconductor units through design modifications in structure and/or process is still a continuous issue for those in the relevant fields.

SUMMARY OF THE INVENTION

A semiconductor device and a manufacturing method thereof are provided in the present invention. A portion of the gate structure is disposed in a trench located in a semiconductor substrate and the gate structure includes gate oxide layers with different thicknesses for reducing the area occupied by the semiconductor device and/or improving the electrical performance of the semiconductor device.

According to an embodiment of the present invention, a semiconductor device is provided. The semiconductor device includes a semiconductor substrate, a trench, and a gate structure. The trench is disposed in the semiconductor substrate, and the gate structure is disposed on the semiconductor substrate. The gate structure includes a gate electrode, a first gate oxide layer, and a second gate oxide layer. A first portion of the gate electrode is disposed in the trench, and a second portion of the gate electrode is disposed outside the trench. The first gate oxide layer is disposed between the gate electrode and the semiconductor substrate, and at least a portion of the first gate oxide layer is disposed in the trench. The second gate oxide layer is disposed between the second portion of the gate electrode and the semiconductor substrate in a vertical direction, and a thickness of the second gate oxide layer is greater than a thickness of the first gate oxide layer.

According to an embodiment of the present invention, a manufacturing method of a semiconductor device is provided. The manufacturing method includes the following steps. A trench is formed in a semiconductor substrate, and a gate structure is formed on the semiconductor substrate. The gate structure includes a gate electrode, a first gate oxide layer, and a second gate oxide layer. A first portion of the gate electrode is disposed in the trench, and a second portion of the gate electrode is disposed outside the trench. The first gate oxide layer is disposed between the gate electrode and the semiconductor substrate, and at least a portion of the first gate oxide layer is disposed in the trench. The second gate oxide layer is disposed between the second portion of the gate electrode and the semiconductor substrate in a vertical direction, and a thickness of the second gate oxide layer is greater than a thickness of the first gate oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a manufacturing method of the semiconductor device according to the first embodiment of the present invention, wherein

FIG. 9 and FIG. 10 are schematic drawings illustrating a manufacturing method of the semiconductor device according to the second embodiment of the present invention, wherein

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
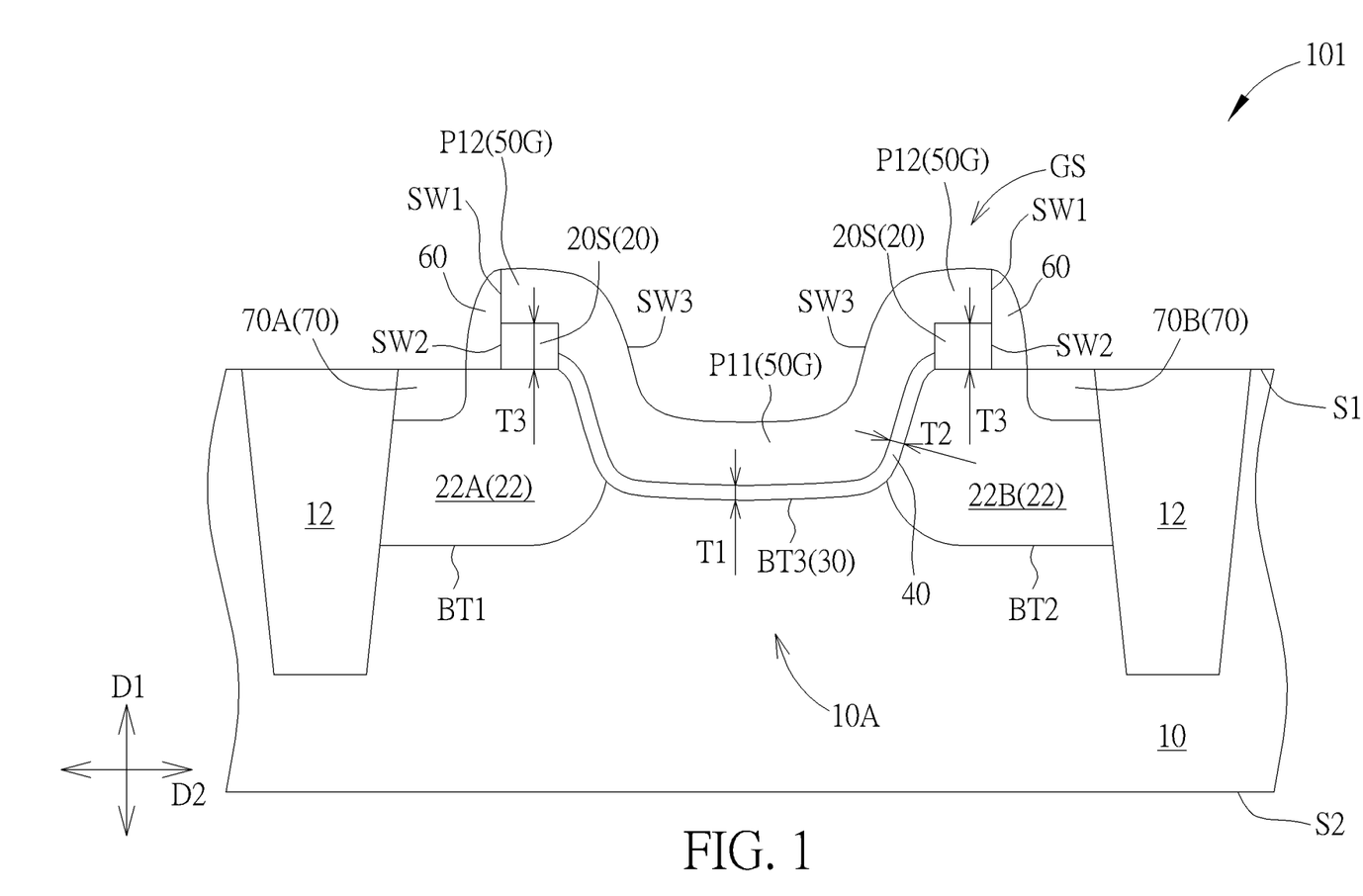
FIG. 1 is a schematic drawing illustrating a semiconductor device according to a first embodiment of the present invention.

Please refer to FIG. 1. FIG. 1 is a schematic drawing illustrating a semiconductor device 101 according to a first embodiment of the present invention. As shown in FIG. 1, the semiconductor device 101 includes a semiconductor substrate 10, a trench 30, and a gate structure GS. The trench 30 is disposed in the semiconductor substrate 10, and the gate structure GS is disposed on the semiconductor substrate 10. The gate structure GS includes a gate electrode 50G, a first gate oxide layer 40, and a second gate oxide layer 20S. A first portion P11 of the gate electrode 50G is disposed in the trench 30, and a second portion P12 of the gate electrode 50G is disposed outside the trench 30. The first gate oxide layer 40 is disposed between the gate electrode 50G and the semiconductor substrate 10, and at least a portion of the first gate oxide layer 40 is disposed in the trench 30. The second gate oxide layer 20S is disposed between the second portion P12 of the gate electrode 50G and the semiconductor substrate 10 in a vertical direction D1, and a thickness of the second gate oxide layer 20S (such as a thickness T3 shown in FIG. 1) is greater than a thickness of the first gate oxide layer 40 (such as a thickness T1 and/or a thickness T2 shown in FIG. 1). The area occupied by the semiconductor device 101 in the vertical direction D1 may be relatively reduced by disposing a portion of the gate structure GS in the trench 30 within the semiconductor substrate 10, and the amounts and/or the density of the semiconductor devices 101 disposed on the semiconductor substrate 10 may be increased accordingly. Additionally, the relatively thicker second gate oxide layer 20S may be used to reduce the electric field at the edge of the gate structure GS, and the reliability and/or the related electrical performance of the semiconductor device 101 may be improved accordingly.

In some embodiments, the vertical direction D1 described above may be regarded as a thickness direction of the semiconductor substrate 10, and the semiconductor substrate 10 may have a top surface S1 and a bottom surface S2 opposite to the top surface S1 in the vertical direction D1. In some embodiments, the trench 30 may be regarded as a structure recessed from the top surface S1 of the semiconductor substrate 10 to the bottom surface S2 of the semiconductor substrate 10, and the gate structure GS may be disposed at a side of the top surface S1. In addition, horizontal directions (such as a horizontal direction D2 shown in FIG. 1 and/or other directions orthogonal to the vertical direction D1) substantially orthogonal to the vertical direction D1 may be substantially parallel with the top surface S1 and/or the bottom surface S2 of the semiconductor substrate 10, but not limited thereto. In this description, a distance between the bottom surface S2 of the semiconductor substrate 10 and a relatively higher location and/or a relatively higher part in the vertical direction D1 is greater than a distance between the bottom surface S2 of the semiconductor substrate 10 and a relatively lower location and/or a relatively lower part in the vertical direction D1. The bottom or a lower portion of each component may be closer to the bottom surface S2 of the semiconductor substrate 10 in the vertical direction D1 than the top or upper portion of this component. Another component disposed above a specific component may be regarded as being relatively far from the bottom surface S2 of the semiconductor substrate 10 in the vertical direction D1, and another component disposed under a specific component may be regarded as being relatively closer to the bottom surface S2 of the semiconductor substrate 10 in the vertical direction D1.

Specifically, in some embodiments, the semiconductor substrate 10 may include a silicon substrate, an epitaxial silicon substrate, a silicon germanium substrate, a silicon carbide substrate, a silicon-on-insulator (SOI) substrate, or a substrate made of other suitable semiconductor materials. Additionally, in some embodiments, the semiconductor device 101 may further include an isolation structure at least partially disposed in the semiconductor substrate 10 for defining one or more active regions 10A in the semiconductor substrate 10, and the trench 30 may be regarded as being disposed in the active region 10A surrounded by the isolation structure in the horizontal direction D2, but not limited thereto. The isolation structure 12 may include a single layer or multiple layers of insulation materials, such as oxide insulation material or other suitable insulation materials, and the isolation structure 12 may be regarded as a shallow trench isolation (STI) structure, but not limited thereto.

In some embodiments, the semiconductor device 101 may further include two drift regions 22 (such as a first drift region 22A and a second drift region 22B shown in FIG. 1) and two source/drain regions 70 (such as a first source/drain region 70A and a second drain region 70B shown in FIG. 1). The first drift region 22A and the second drift region 22B may be disposed in the semiconductor substrate 10 and located at two opposite sides of the trench 30 in the horizontal direction, respectively. The first source/drain region 70A and the second source/drain region 70B may be disposed in the first drift region 22A and the second drift region 22B, respectively. In some embodiments, the two source/drain regions 70 may be a source region and a drain region, respectively (for example, the first source/drain region 70A may be a source region and the second source/drain region 70B may be a drain region, or the second source/drain region 70B may be a source region and the first source/drain region 70A may be a drain region), and the semiconductor device 101 may be regarded as a double diffused drain MOS (DDDMOS), but not limited thereto.

In some embodiments, the drift regions 22 may include doped regions formed by performing a doping process (such as an implantation process) to the semiconductor substrate 10. The semiconductor substrate 10 may be a semiconductor substrate with a first conductivity type or include a first conductivity type region (such as a doped well region with the first conductive type, not illustrated), the drift regions 22 may have a second conductivity type, and the second conductivity type may be complementary to the first conductivity type. For example, in this embodiment, the first conductivity type may be p-type, and the second conductivity type may be n-type, but not limited thereto. In other words, the semiconductor substrate 10 may be a p-type semiconductor substrate or a semiconductor substrate including a p-type well region, and the drift regions 22 may be n-type doped regions, or the semiconductor substrate 10 may be an n-type semiconductor substrate or a semiconductor substrate including an n-type well region, and the drift regions 22 may be p-type doped regions. In some embodiments, the source/drain regions 70 may include doped regions formed in the semiconductor substrate 10 by a doping process (such as an implantation process), the conductivity type of the source/drain region 70 may be identical to the conductivity type of the drift region 22, but the doping concentration of the source/drain region 70 may be higher than the doping concentration of the drift region 22. For example, the source/drain region 70 may be an n-type heavily doped region, but not limited thereto.

In some embodiments, the first portion P11 of the gate electrode 50G may be disposed in the trench 30 and located between the two drift regions 22 in the horizontal direction D2. At least a portion of the first gate oxide layer 40 may be disposed between the first portion P11 of the gate electrode 50G and each of the drift regions 22 in the horizontal direction D2. For example, a portion of the first gate oxide layer 40 may be disposed between the first portion P11 of the gate electrode 50G and the first drift region 22A in the horizontal direction D2 and directly contact the first portion P11 of the gate electrode 50G and the first drift region 22A, and another portion of the first gate oxide layer 40 may be disposed between the first portion P11 of the gate electrode 50G and the second drift region 22B in the horizontal direction D2 and directly contact the first portion P11 of the gate electrode 50G and the second drift region 22B, but not limited thereto.

In some embodiments, the first gate oxide layer 40 may be conformally disposed on the surface of the trench 30 substantially, and the thickness T1 of the first gate oxide layer 40 disposed between the first portion P11 of the gate electrode 50G and the semiconductor substrate 10 in the vertical direction D1 may be substantially equal to the thickness T2 of the first gate oxide layer 40 disposed between the first portion P11 of the gate electrode 50G and the drift region 22 in the horizontal direction D2, but not limited thereto. By disposing the gate electrode 50G and at least a portion of the first gate oxide layer 40 in the trench 30 and disposing the first gate oxide layer 40 conformally on the surface of the trench 30, the region where the gate electrode 50G and the drift region 22 overlap may extend along the sidewall of the trench 30, and the area occupied by the semiconductor device 101 and/or the gate structure GS in the vertical direction D1 may be relatively reduced under the requirement of a specific overlapping area between the gate electrode 50G and the drift region 22. In some embodiments, the sidewall of the trench 30 may be an inclined sidewall (i.e. being not parallel with the vertical direction D1), and a portion of each drift region 22 may be disposed under the trench 30 in the vertical direction D1, but not limited thereto. Additionally, in some embodiments, the bottom of each drift region 22 (such as a bottom BT1 of the first drift region 22A and a bottom BT2 of the second drift region 22B) may be lower than a bottom BT3 of the trench 30 in the vertical direction D1 for improving the electrical performance (such as the ability to withstand high voltage), but not limited thereto. In some embodiments, the bottom BT1, the bottom BT2, and the bottom BT3 described above may be the bottommost portions of the first drift region 22A, the second drift region 22B, and the trench 30 in the vertical direction D1, respectively, and the bottom BT1, the bottom BT2, and the bottom BT3 may be regarded as a portion with the shortest distance between the first drift region 22A and the bottom surface S2 of the semiconductor substrate 10, a portion with the shortest distance between the second drift region 22B and the bottom surface S2 of the semiconductor substrate 10, and a portion with the shortest distance between the trench 30 and the bottom surface S2 of the semiconductor substrate 10, respectively, but not limited thereto.

In some embodiments, the second gate oxide layer 20S may be disposed outside the trench 30 and located at opposite edges in the gate structure GS. For example, the second gate oxide layer 20S may be located at two opposite ends of the gate structure GS in the horizontal direction D2, but not limited thereto. In addition, the second gate oxide layer 20S may be disposed between the second portion P12 of the gate electrode 50G and each drift region 22 in the vertical direction D1. For example, a portion of the second gate oxide layer 20S may be disposed between the second portion P12 of the gate electrode 50G and the first drift region 22A in the vertical direction D1, another portion of the second gate oxide layer 20S may be disposed between the second portion P12 of the gate electrode 50G and the second drift region 22B in the vertical direction D1, and the thickness T3 of the second gate oxide layer 20S may be greater than the thickness of the first gate oxide layer 40 (such as the thickness T1 and/or the thickness T2). Additionally, the thickness T1 may be regarded as a length of the first gate oxide layer 40 disposed at the bottom of the trench 30 in the vertical direction D1, and the thickness T3 may be regarded as a length of the second gate oxide layer 20S in the vertical direction D1, but not limited thereto.

In some embodiments, the first gate oxide layer 40 and the second gate oxide layer 20S may be formed by different manufacturing processes, respectively, and the material composition of the first gate oxide layer 40 may be identical to or different from the material composition of the second gate oxide layer 20S according to some design considerations. For example, the first gate oxide layer 40 and the second gate oxide layer 20S may include silicon oxide or other suitable oxide dielectric materials. In some embodiments, the first gate oxide layer 40 and the second gate oxide layer 20S may include similar material (for example, both may be silicon oxide, but not limited thereto), but some material properties (such as density, lattice arrangement, ratio of silicon atoms to oxygen atoms, and/or equivalent dielectric constant) of the first gate oxide layer 40 may be different from those of the second gate oxide layer 20S because the first gate oxide layer 40 and the second gate oxide layer 20S may be formed by different manufacturing processes, respectively. In some embodiments, the second gate oxide layer 20S may be disposed outside the trench 30 without being disposed in the trench 30, the first gate oxide layer 40 may be directly connected with the second gate oxide layer 20S, and the gate electrode 50G may completely cover the first gate oxide layer 40 and the second gate oxide layer 20S in the vertical direction D1, but not limited thereto.

In some embodiments, the semiconductor device 101 may further include a spacer structure 60 disposed on a sidewall of the gate structure GS, and the spacer structure GS may include a single layer or multiple layers of dielectric materials, such as silicon nitride, silicon oxynitride, or other suitable dielectric materials. In some embodiments, a sidewall SW1 of the second portion P12 of the gate electrode 50G and a sidewall SW2 of the second gate oxide layer 20S may be substantially aligned and flush with each other and may be regarded as the sidewall of the gate structure GS. Therefore, the spacer structure 60 may be disposed on and directly contact the sidewall SW1 of the second portion P12 of the gate electrode 50G and the sidewall SW2 of the second gate oxide layer 20S, but not limited thereto. In some embodiments, the gate structure GS may be substantially disposed on the semiconductor substrate 10 and disposed in the trench 30 conformally. Therefore, the top surface of the gate structure 50G may include a recessed surface located corresponding to the trench 30 in the vertical direction D1, and a sidewall SW3 of the recessed surface may be regarded as an inner sidewall of the gate structure GS, but not limited thereto. In addition, the first portion P11 of the gate electrode 50G disposed in the trench 30 may be directly connected with the second portion P12 of the gate electrode 50G disposed outside the trench 30. In some embodiments, the spacer structure 60 described above may be further formed on the inner sidewall of the gate structure GS (such as the sidewall SW3) because of the approach of forming the spacer structure 60, but not limited thereto. In some embodiments, the gate electrode 50G may include a non-metallic electrically conductive material (such as doped polysilicon) or a metallic electrically conductive material, such as a metal gate structure formed with an electrically conductive work function layer and a low electrical resistivity layer stacked with each other, but not limited thereto.

Figure 2:
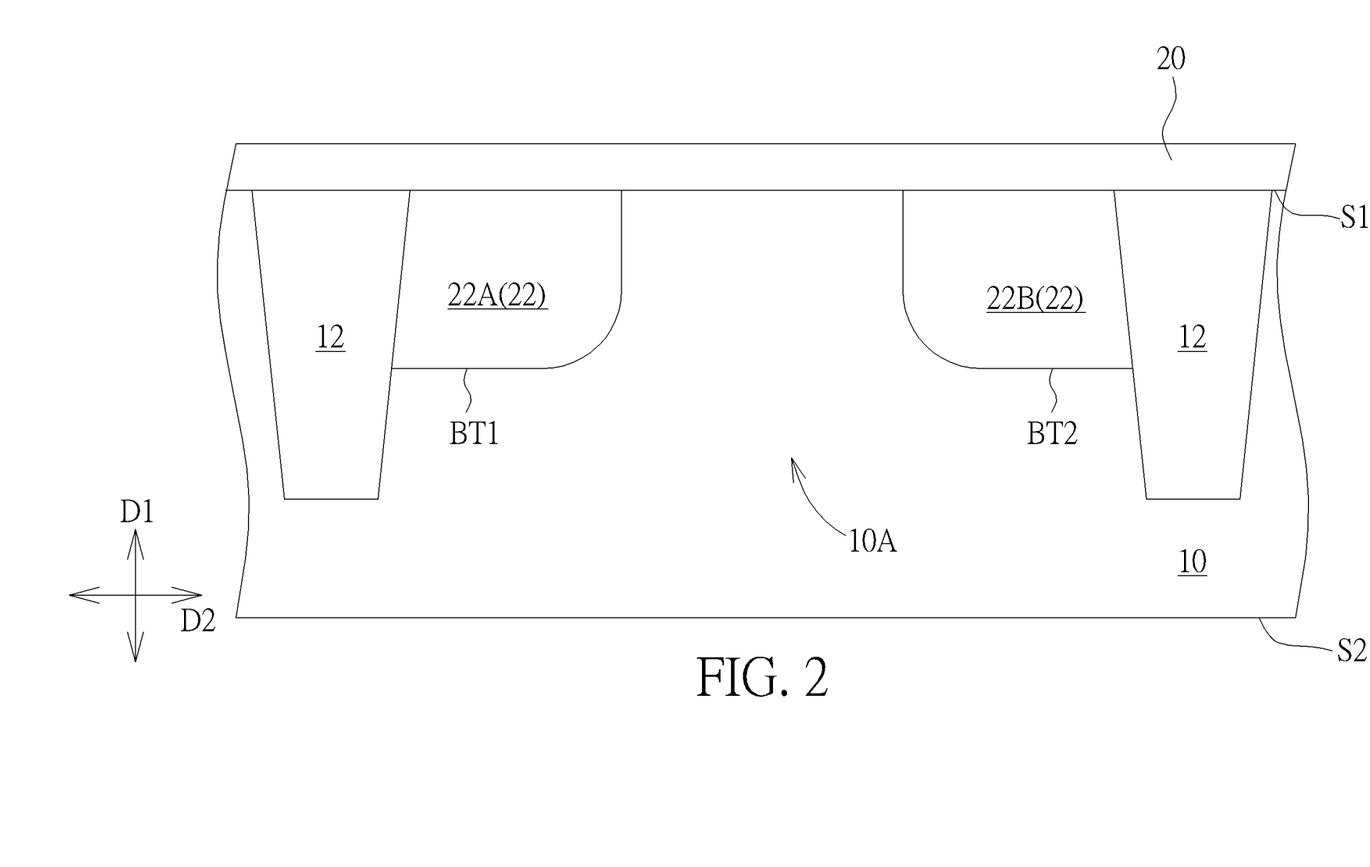
Figure 3:
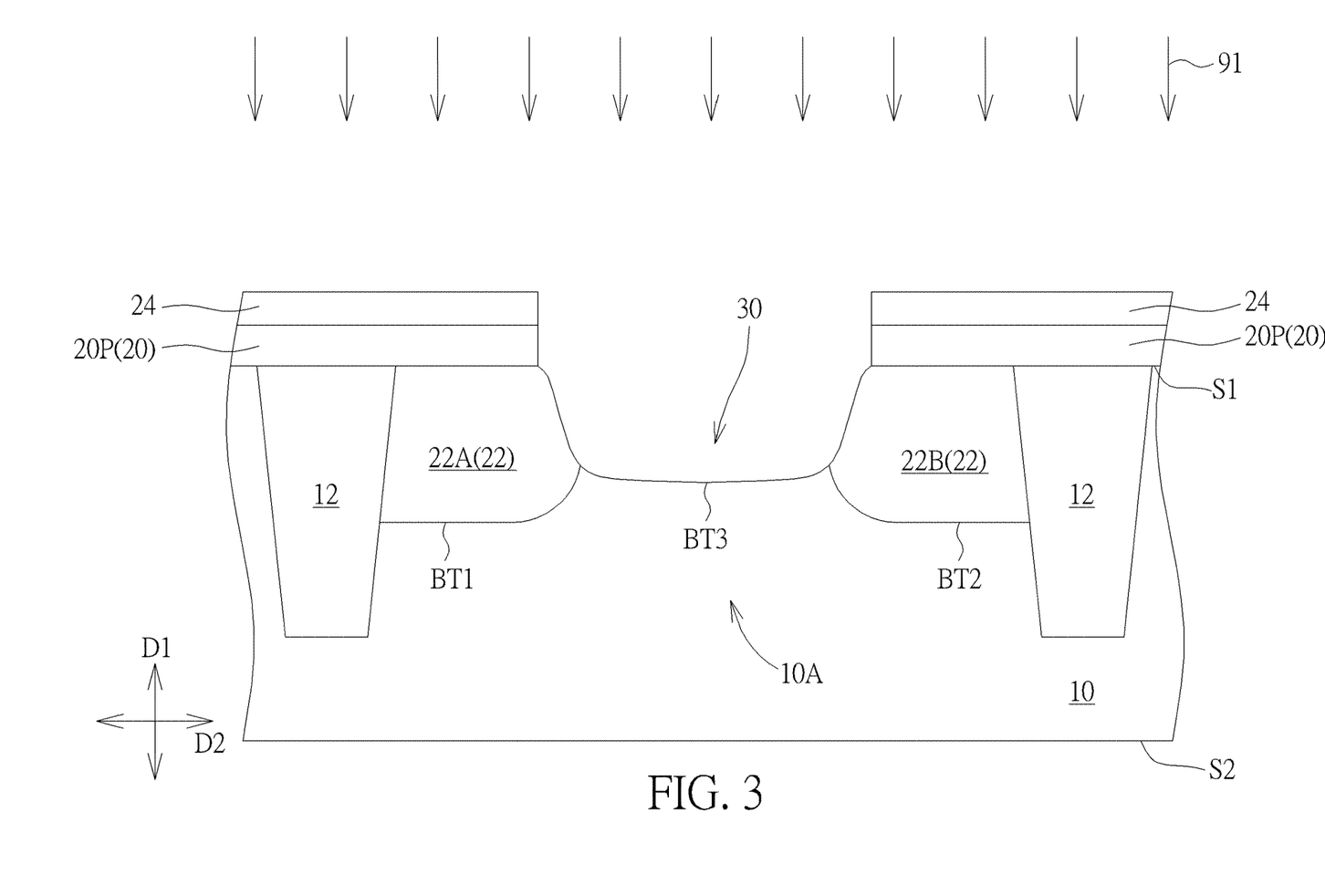
FIG. 3 is a schematic drawing in a step subsequent to FIG. 2.
Figure 4:
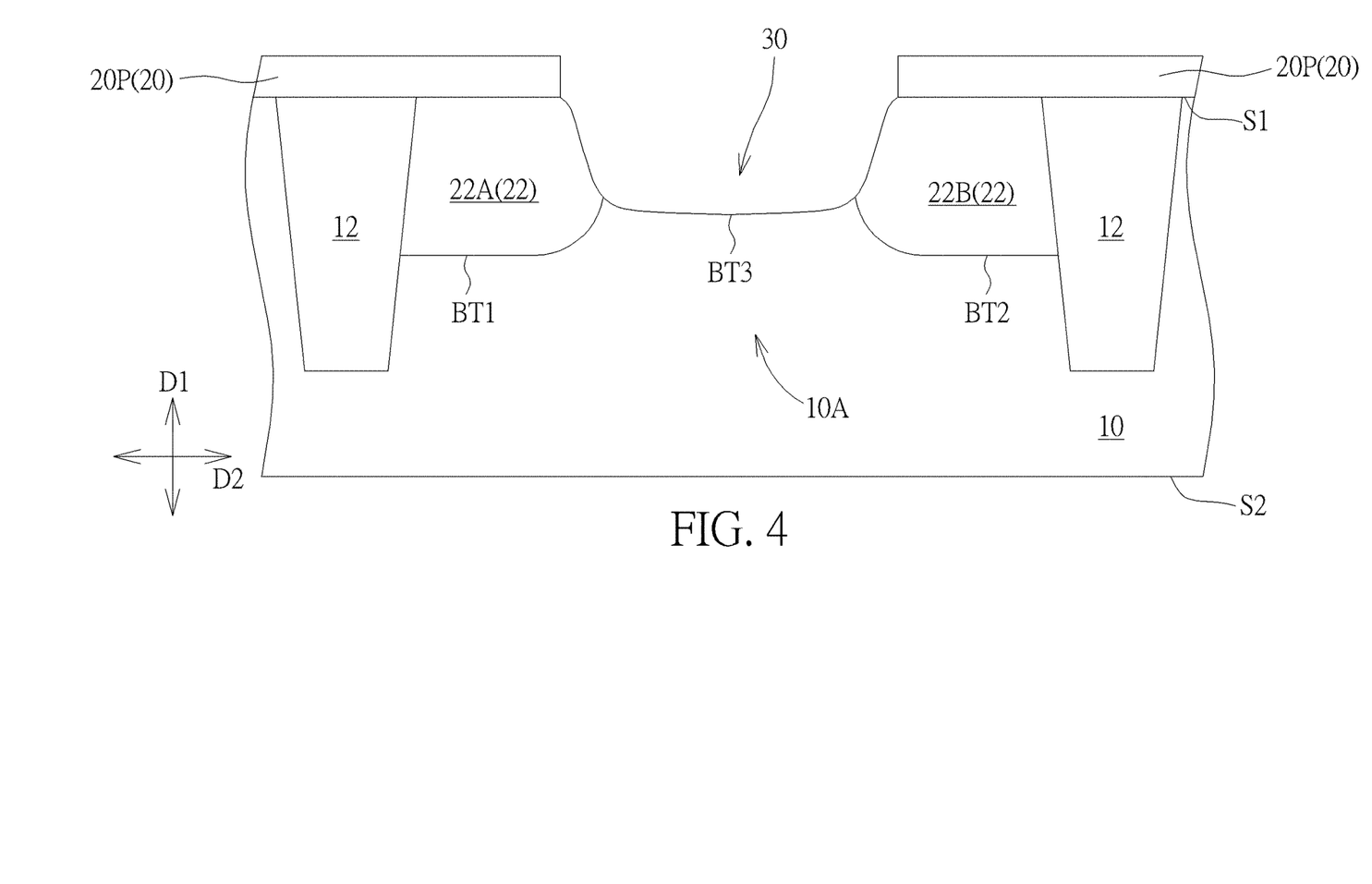
FIG. 4 is a schematic drawing in a step subsequent to FIG. 3.
Figure 5:
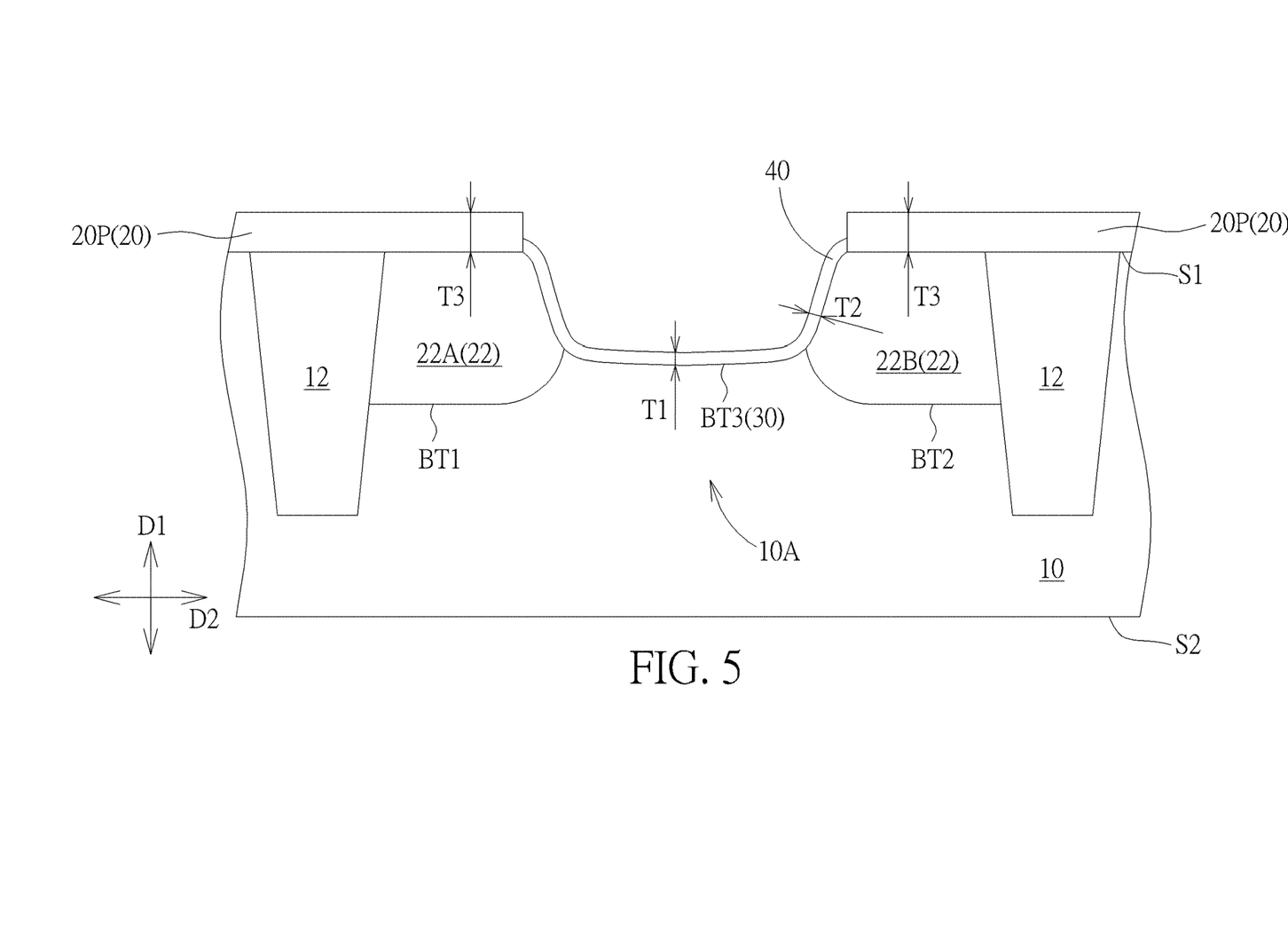
FIG. 5 is a schematic drawing in a step subsequent to FIG. 4.
Figure 6:
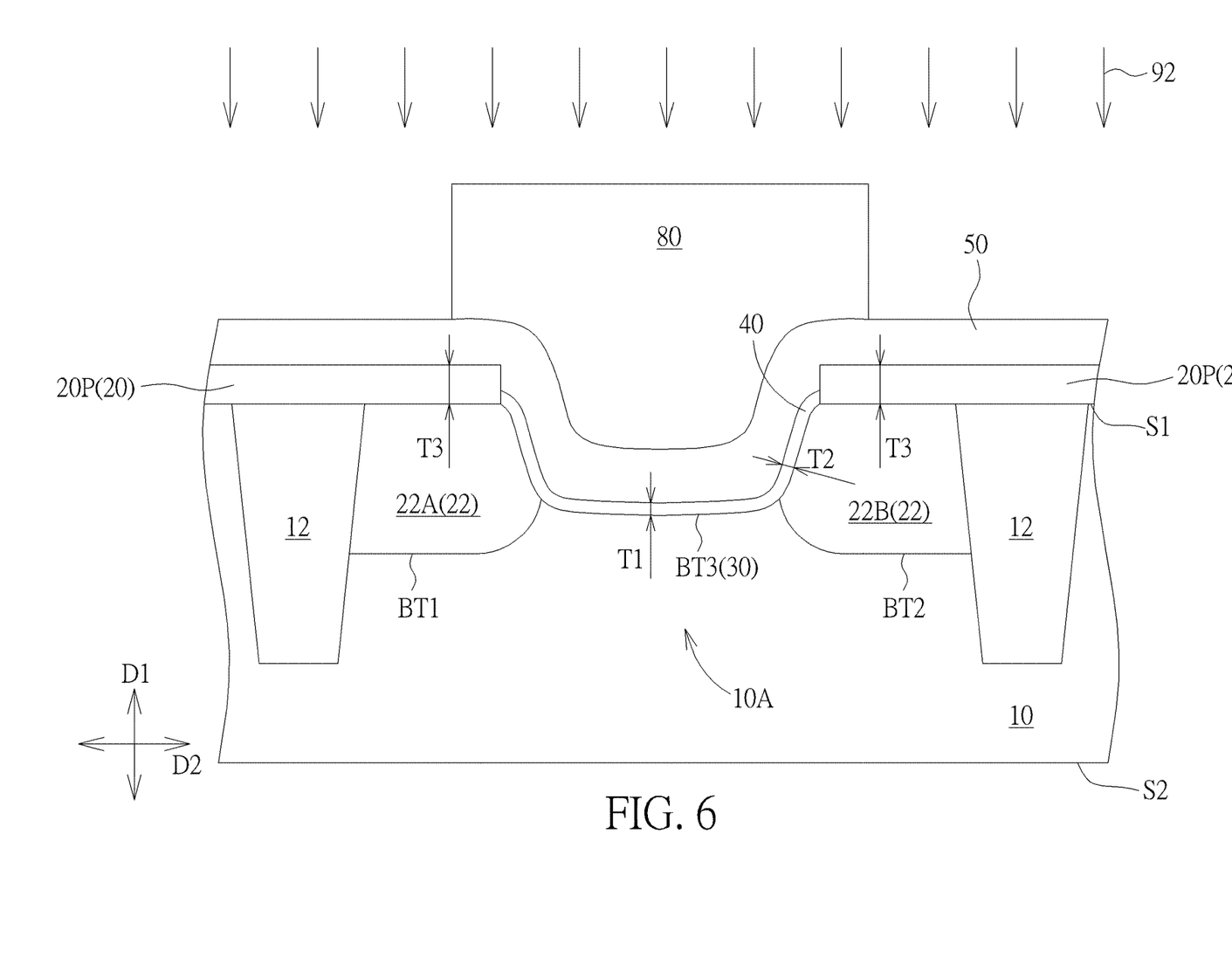
FIG. 6 is a schematic drawing in a step subsequent to FIG. 5.
Figure 7:
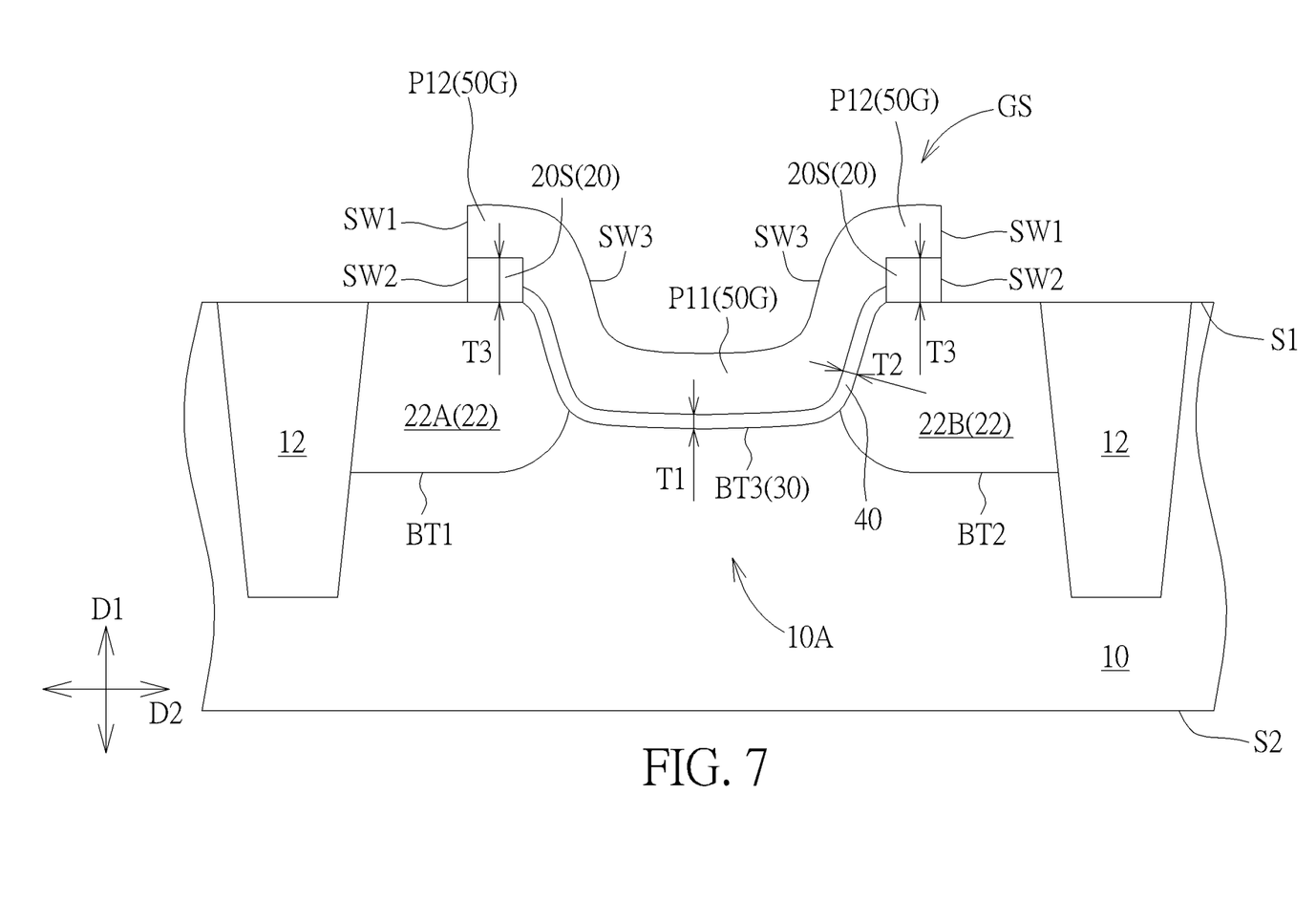
FIG. 7 is a schematic drawing in a step subsequent to FIG. 6.

Please refer to FIGS. 1-7. FIGS. 2-7 are schematic drawings illustrating a manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6. In some embodiments, FIG. 1 may be regarded as a schematic drawing in a step subsequent to FIG. 7, but not limited thereto. As shown in FIG. 1, the manufacturing method of the semiconductor device 101 may include the following steps. Firstly, the trench 30 is formed in the semiconductor substrate 10, and the gate structure GS is formed on the semiconductor substrate 10. The gate structure GS includes the gate electrode 50G, the first gate oxide layer 40, and the second gate oxide layer 20S. The first portion P11 of the gate electrode 50G is disposed in the trench 30, and the second portion P12 of the gate electrode 50G is disposed outside the trench 30. The first gate oxide layer 40 is disposed between the gate electrode 50G and the semiconductor substrate 10, and at least a portion of the first gate oxide layer 40 is disposed in the trench 30. The second gate oxide layer 20S is disposed between the second portion P12 of the gate electrode 50G and the semiconductor substrate 10 in the vertical direction D1, and the thickness T3 of the second gate oxide layer 20S is greater than the thickness T1 of the first gate oxide layer 40 and/or the thickness T2 of the first gate oxide layer 40.

Specifically, the manufacturing method of the semiconductor device in this embodiment may include but is not limited to the following steps. Firstly, as shown in FIG. 2, a pad oxide layer 20 is formed on the semiconductor substrate 10, and the isolation structure 12 may be formed in the semiconductor substrate 10 before the step of forming the pad oxide layer 20. The pad oxide layer 20 may include silicon oxide or other suitable oxide dielectric materials, and the pad oxide layer 20 may be formed by suitable manufacturing approaches (such as an oxidation process and/or a deposition process). In addition, the two drift regions 22 may be formed in the semiconductor substrate 10. The drift regions may be formed in the active region 10A defined by the isolation structure 12, and the drift regions 22 may be surrounded by the isolation structure 12 in the horizontal direction (such as the horizontal direction D2 and/or other directions orthogonal to the vertical direction D1). In some embodiments, the drift regions 22 may be formed in the semiconductor substrate 10 after the step of forming the pad oxide layer 20, but not limited thereto. In some embodiments, the pad oxide layer 20 may be formed after the step of forming the drift regions 22 according to some design considerations. Additionally, in some embodiments, a doped well region (not illustrated) may be formed in the semiconductor substrate 10 according to some design considerations, and the doped well region may be formed in the semiconductor substrate 10 by a suitable doping process before the step of forming the drift regions 22, but not limited thereto.

As shown in FIG. 2 and FIG. 3, a mask layer 24 may be formed on the pad oxide layer 20, and an etching process 91 using mask layer 24 may be performed to the pad oxide layer 20 and the semiconductor substrate 10 for forming the trench 30. In other words, a portion of the pad oxide layer 20 and a portion of the semiconductor substrate 10 may be removed by the etching process 91, the pad oxide layer 20 may be etched to be a patterned oxide layer 20P by the etching process 91, and the patterned oxide layer 20P may be located outside the trench 30. In some embodiments, the mask layer 24 may include silicon nitride or other suitable mask materials, and the material composition of the mask layer 24 may be different from the material composition of the pad oxide layer 20 and the material composition of the semiconductor substrate 10 for providing required etching selectivity. In some embodiments, the drift regions 22 may be formed in the semiconductor substrate 10 after the step of forming the pad oxide layer 20 and before the etching process 91, and a part of each of the drift regions 22 may be removed by the etching process 91 for forming the trench 30. The two drift regions 22 may be located at two opposite sides of the trench 30 in the horizontal direction D2, respectively, and a portion of each of the drift regions 22 may be exposed by the trench 30. Subsequently, as shown in FIG. 3 and FIG. 4, the mask layer 24 may be removed after the step of forming the trench 30.

As shown in FIG. 4 and FIG. 5, the first gate oxide layer 40 may be formed. In some embodiments, the first gate oxide layer 40 may be formed by an oxidation process such as an in-situ steam generation (ISSG) process, a deposition process such as an atomic layer deposition (ALD) process, or other suitable approaches. For example, when the first gate oxide layer 40 is formed by an oxidation process, the first gate oxide layer 40 may be formed on the semiconductor substrate 10 and the drift regions 22 exposed by the trench 30 without being directly formed the top surface of the patterned oxide layer 20P, and the first gate oxide layer 40 may be connected with the side surface of the patterned oxide layer 20P, but not limited thereto. Additionally, in some embodiments, the patterned oxide layer 20P may be further patterned to be the second gate oxide layer described above in the subsequent process, and the thickness of the first gate oxide layer 40 (such as the thickness T1 and/or the thickness T2) may be less than the thickness of the patterned oxide layer 20P (such as the thickness T3).

As shown in FIG. 5 and FIG. 6, a gate material layer 50 may be formed on the semiconductor substrate 10, the gate material layer 50 may be partly formed in the trench 30 and partly formed outside the trench 30 (such as being formed on the patterned oxide layer 20P), and the patterned oxide layer 20P may be located between the gate material layer 50 and the semiconductor substrate 10 in the vertical direction D1. In other words, the gate material layer 50 may be formed after the step of forming the trench 30 (such as the etching process 91 shown in FIG. 3), and the first gate oxide layer 40 be formed after the etching process 91 before the step of forming the gate material layer 50. In some embodiments, the gate material layer 50 may be conformally formed on the patterned oxide layer 20P and conformally formed in the trench 30 substantially, and the top surface of the gate material layer 50 may include a recessed surface located corresponding to the trench 30 in the vertical direction D1, but not limited thereto. The gate material layer 50 may include a non-metallic electrically conductive material (such as doped polysilicon) or other suitable electrically conductive materials. In some embodiments, the gate material layer 50 may include material layers (not illustrated), such as an electrically conductive material layer and a dielectric material layer disposed and stacked, and the dielectric material layer may be regarded as a gate capping layer when the dielectric material layer is disposed on the electrically conductive material layer, but not limited thereto. Subsequently, a patterned mask layer 80 may be formed on the gate material layer 50, and a patterning process 92 using the patterned mask layer 80 as a mask may be performed to the gate material layer 50 and the patterned oxide layer 20P.

As shown in FIG. 6 and FIG. 7, in some embodiments, the patterning process 92 may include one or more etching steps for etching the gate material layer 50 and the patterned oxide layer 20P without being covered by the patterned mask layer 80, respectively, and the patterned mask layer 80 may be removed after the patterning process 92. The gate material layer 50 may be patterned to be the gate electrode 50G by the patterning process 92, and the patterned oxide layer 20P may be patterned to be the second gate oxide layer 20S by the patterning process 92. In some embodiments, the sidewall SW1 of the gate electrode 50G and the sidewall SW2 of the second gate oxide layer 20S may be substantially aligned and flush with each other and may be regarded as the sidewall of the gate structure GS because the gate electrode 50G and the second gate oxide layer 20S may be formed by the patterning process 92 using the same mask (such as the patterned mask layer 80), but not limited thereto. Additionally, in the present invention, the method of forming the gate structure GS may include but is not limited to the steps shown in FIGS. 2-7 described above. In other words, the gate structure GS illustrated in FIG. 7 and FIG. 1 may also be formed by other approaches according to some design considerations.

As shown in FIG. 7 and FIG. 1, after the step of forming the gate structure GS, the spacer structure 60 may be formed on the sidewall of the gate structure GS (such as the sidewall SW1 and the sidewall SW2), and the space structure 60 may be located on the sidewall SW1 of the second portion P12 of the gate electrode 50G and the sidewall SW2 of the second gate oxide layer 20S accordingly. Subsequently, a doping process using the spacer structure 60 as a mask may be performed to drift regions 22 for forming the source/drain regions 70 in the drift regions 22. In some embodiments, the spacer structure 60 may be formed by performing an etching back process to a spacer material layer formed on the gate structure GS and the semiconductor substrate 10, and a part of the spacer structure 60 may be further formed on the inner sidewall of the gate structure GS (such as the sidewall SW3) accordingly, but not limited thereto. In other words, the space structure 60 may also be formed on the sidewall of the gate structure GS by other suitable approaches and may not be formed on the inner sidewall of the gate structure GS accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
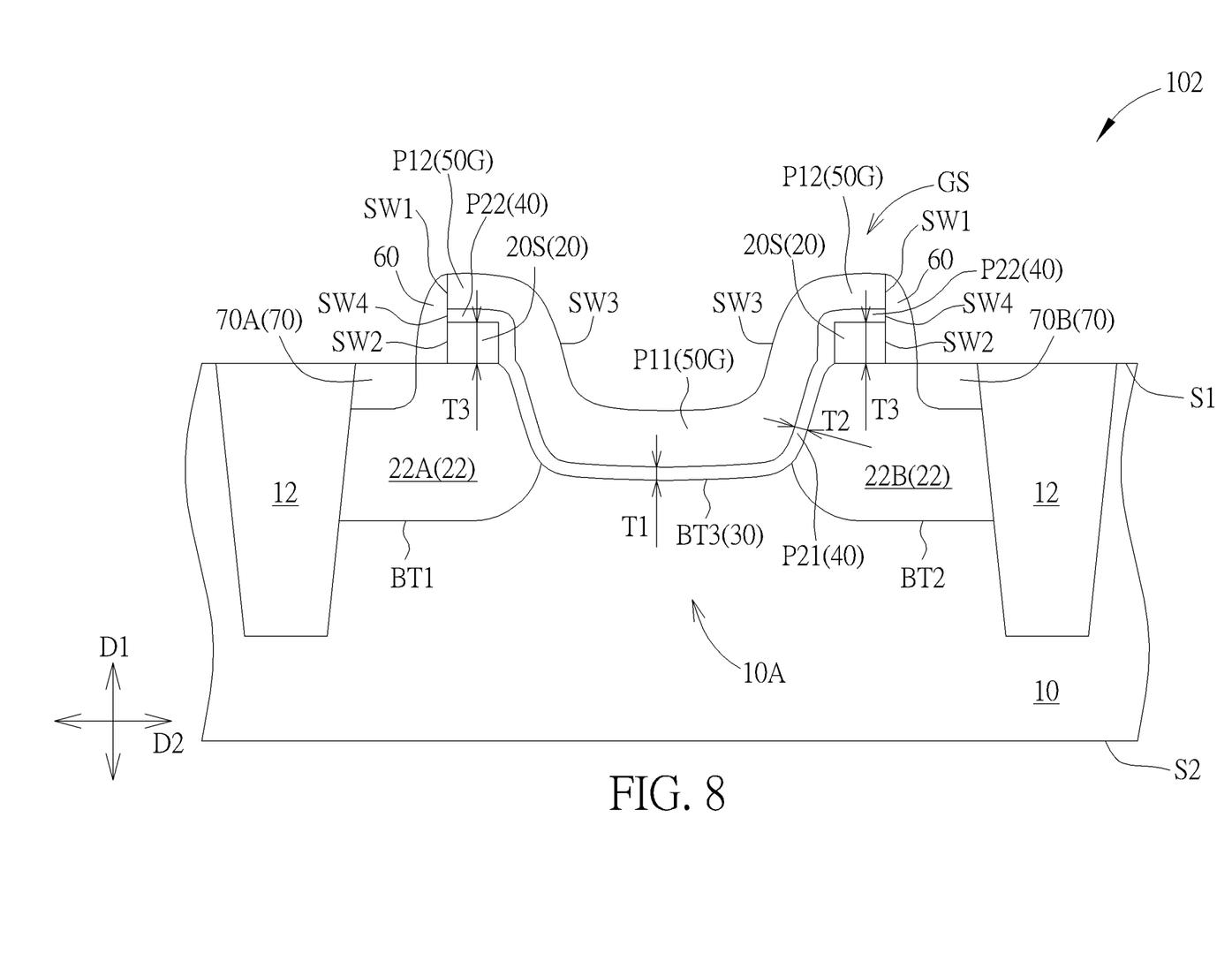
FIG. 8 is a schematic drawing illustrating a semiconductor device according to a second embodiment of the present invention.

Please refer to FIG. 8. FIG. 8 is a schematic drawing illustrating a semiconductor device 102 according to a second embodiment of the present invention. As shown in FIG. 8, in the semiconductor device 102, a first portion P21 of the first gate oxide layer 40 may be disposed in the trench 30, and a second portion P22 of the first oxide layer 40 may be disposed between the second portion P12 of the gate electrode 50G and the second gate oxide layer 20S in the vertical direction D1. In some embodiments, the first gate oxide layer 40 disposed outside the trench 30 may cover the inner sidewall and the top surface of the second gate oxide layer 20S and directly contact the second gate oxide layer 20S. The first gate oxide layer 40 disposed outside the trench 30 may be directly connected with the first portion P21 of the first gate oxide layer 40 disposed in the trench 30. In some embodiments, the sidewall SW1 of the second portion P12 of the gate electrode 50G, the sidewall SW2 of the second gate oxide layer 20S, and a sidewall SW4 of the second portion P22 of the first gate oxide layer 40 may be substantially aligned and flush with one another and may be regarded as the sidewall of the gate structure GS. Therefore, the spacer structure 60 may be disposed on and directly contact the sidewall SW1, the sidewall SW2, and the sidewall SW4, but not limited thereto.

Figure 9:
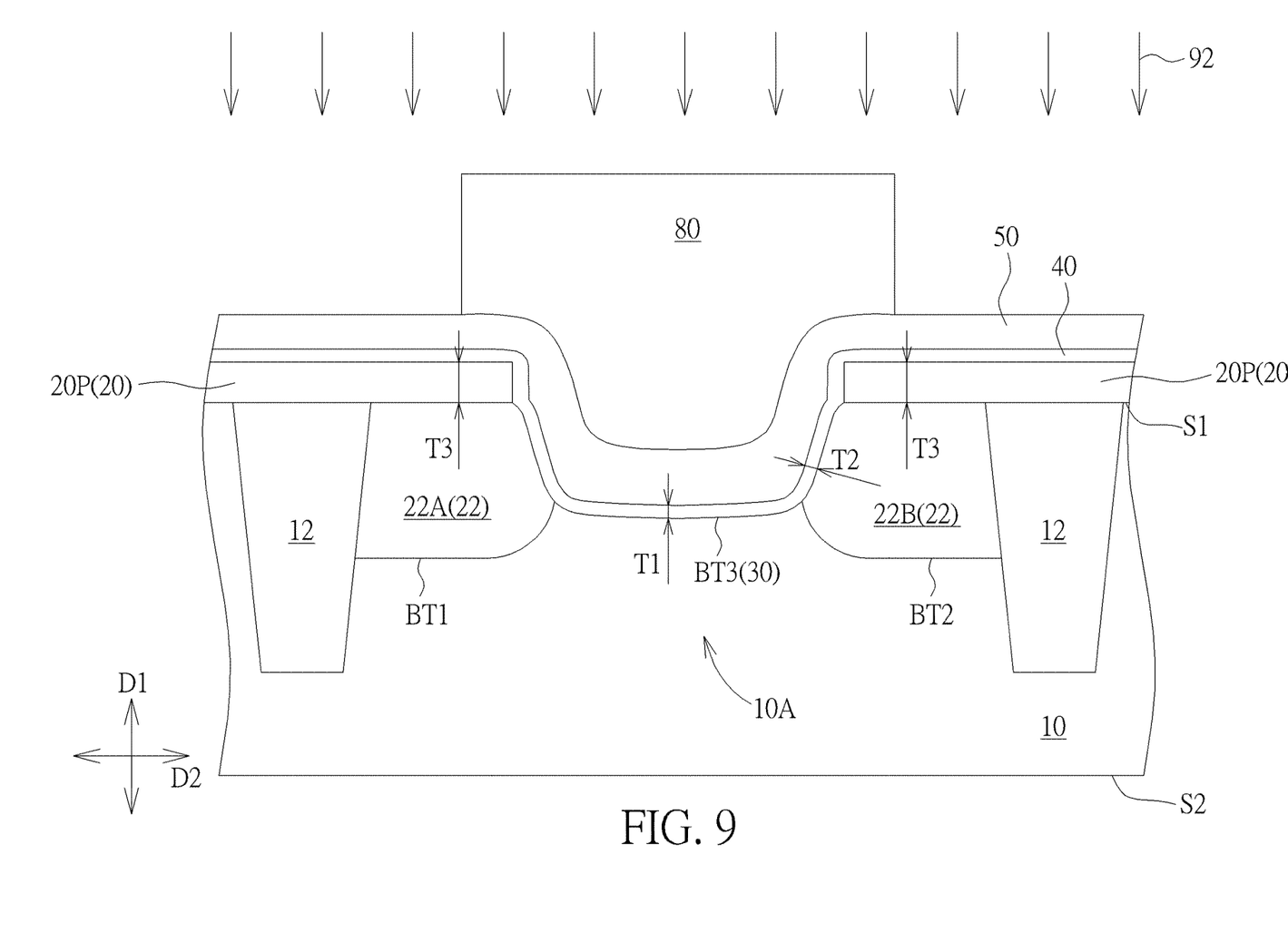
Figure 10:
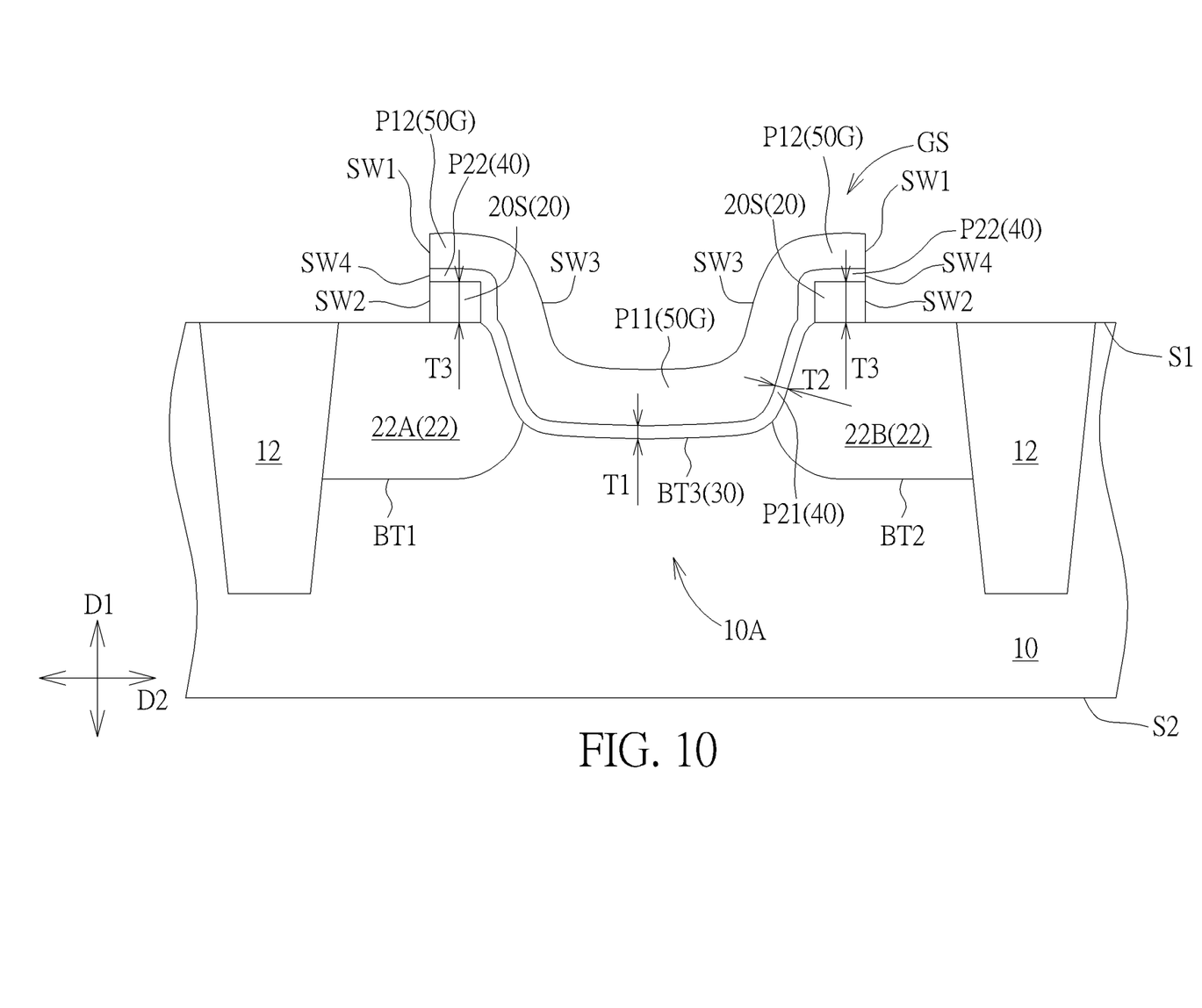
FIG. 10 is a schematic drawing in a step subsequent to FIG. 9.

Please refer to FIGS. 8-10. FIG. 9 and FIG. 10 are schematic drawings illustrating a manufacturing method of the semiconductor device 102 according to the second embodiment of the present invention, and FIG. 10 is a schematic drawing in a step subsequent to FIG. 9. In some embodiments, FIG. 8 may be regarded as a schematic drawing in a step subsequent to FIG. 10, but not limited thereto. As shown in FIG. 9, in some embodiments, the first gate oxide layer 40 may be formed by a deposition process (such as an atomic layer deposition process or other suitable deposition approaches), and the first gate oxide layer 40 may be formed on the patterned oxide layer 20P and formed on the semiconductor substrate 10 and the drift regions 22 exposed by the trench 30 accordingly. The first gate oxide layer 40 may cover the side surface and the top surface of the patterned oxide layer 20P and the first gate oxide layer 40 may be directly connected with the patterned oxide layer 20P, but not limited thereto. After the step of forming the first gate oxide layer 40, the gate material layer 50 and the patterned mask layer 80 may be formed, and the patterning process 92 using the patterned mask layer 80 as a mask may then be performed to the gate material layer 50, the first gate oxide layer 40, and the patterned oxide layer 20P.

As shown in FIG. 9 and FIG. 10, in some embodiments, the patterning process 92 may include one or more etching steps for etching the gate material layer 50, the first gate oxide layer 40, and the patterned oxide layer 20P without being covered by the patterned mask layer 80, respectively. In some embodiments, after the patterning process 92, the sidewall SW1 of the gate electrode 50G, the sidewall SW2 of the second gate oxide layer 20S, and the sidewall SW4 of the first gate oxide layer 40 may be substantially aligned and flush with one another and may be regarded as the sidewall of the gate structure GS, but not limited thereto. As shown in FIG. 10 and FIG. 8, after the step of forming the gate structure GS, the spacer structure 60 and the source/drain regions 70 may be formed. In some embodiments, the spacer structure 60 may be formed on and directly contact the sidewall of the gate structure GS (such as the sidewall SW1, the sidewall SW2, and the sidewall SW4), but not limited thereto.

To summarize the above descriptions, according to the semiconductor device and the manufacturing method thereof in the present invention, the area occupied by the semiconductor device in the vertical direction may be relatively reduced by disposing a portion of the gate structure in the trench within the semiconductor substrate, and the amounts and/or the density of the semiconductor devices disposed on the semiconductor substrate may be increased accordingly. Additionally, the relatively thicker second gate oxide layer may be used to reduce the electric field at the edge of the gate structure, and the reliability and/or the related electrical performance of the semiconductor device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
  a semiconductor substrate;
  a trench disposed in the semiconductor substrate; and
  a gate structure disposed on the semiconductor substrate, wherein the gate structure comprises:
    a gate electrode, wherein a first portion of the gate electrode is disposed in the trench, and a second portion of the gate electrode is disposed outside the trench;
    a first gate oxide layer disposed between the gate electrode and the semiconductor substrate, wherein at least a portion of the first gate oxide layer is disposed in the trench; and
    a second gate oxide layer disposed between the second portion of the gate electrode and the semiconductor substrate in a vertical direction, wherein a thickness of the second gate oxide layer is greater than a thickness of the first gate oxide layer, and a sidewall of the second portion of the gate electrode and a sidewall of the second gate oxide layer are aligned with each other in the vertical direction and flush with each other.

2. The semiconductor device according to claim 1, further comprising:
  two drift regions disposed in the semiconductor substrate and located at two opposite sides of the trench in a horizontal direction, respectively.

3. The semiconductor device according to claim 2, wherein the first portion of the gate electrode is disposed between the two drift regions in the horizontal direction.

4. The semiconductor device according to claim 3, wherein a portion of the first gate oxide layer is disposed between the first portion of the gate electrode and each of the two drift regions in the horizontal direction.

5. The semiconductor device according to claim 2, wherein the second gate oxide layer is disposed between the second portion of the gate electrode and each of the two drift regions in the vertical direction.

6. The semiconductor device according to claim 2, wherein a portion of each of the two drift regions is disposed under the trench in the vertical direction.

7. The semiconductor device according to claim 1, wherein a first portion of the first gate oxide layer is disposed in the trench, and a second portion of the first oxide layer is disposed between the second portion of the gate electrode and the second gate oxide layer in the vertical direction.

8. The semiconductor device according to claim 1, further comprising:
  a spacer structure disposed on a sidewall of the gate structure, wherein the spacer structure is disposed on the sidewall of the second portion of the gate electrode and the sidewall of the second gate oxide layer.

9. The semiconductor device according to claim 1, wherein a material composition of the first gate oxide layer is different from a material composition of the second gate oxide layer.

10. The semiconductor device according to claim 1, wherein the vertical direction is a thickness direction of the semiconductor substrate.

* * * * *